United States Patent
Lin et al.

(10) Patent No.: US 9,231,208 B2
(45) Date of Patent: Jan. 5, 2016

(54) METHOD FOR FORMING MEMORY DEVICE

(71) Applicant: Winbond Electronics Corp., Taichung (TW)

(72) Inventors: Meng-Heng Lin, Taichung (TW); Bo-Lun Wu, Changhua County (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 14/474,883

(22) Filed: Sep. 2, 2014

(65) Prior Publication Data
US 2015/0287919 A1 Oct. 8, 2015

(30) Foreign Application Priority Data
Apr. 8, 2014 (TW) .............................. 103112803 A

(51) Int. Cl.
*H01L 45/00* (2006.01)

(52) U.S. Cl.
CPC ........ *H01L 45/1641* (2013.01); *H01L 45/1233* (2013.01); *H01L 45/146* (2013.01)

(58) Field of Classification Search
CPC ......... H01L 45/00; H01L 29/12; H01L 29/22; H01L 21/44; H01L 29/02; H01L 45/146; H01L 45/1253; H01L 45/1616; H01L 27/24; H01L 23/5228
USPC ............. 438/382, 84, 95, 102, 200, 210, 238, 438/329
See application file for complete search history.

(56) References Cited

U.S. PATENT DOCUMENTS

| | | | |
|---|---|---|---|
| 2007/0176264 A1* | 8/2007 | Lee et al. ........................ | 257/614 |
| 2009/0147558 A1* | 6/2009 | Tamai et al. ................... | 365/148 |
| 2010/0172170 A1 | 7/2010 | Tamai et al. | |

(Continued)

FOREIGN PATENT DOCUMENTS

| | | |
|---|---|---|
| JP | 2007 004873 | 1/2007 |
| JP | 2011 146111 | 7/2011 |

(Continued)

OTHER PUBLICATIONS

Office Action and Search report issued on Mar. 2, 2015 in corresponding TW patent application No. 103112803.

(Continued)

*Primary Examiner* — Chuong A Luu
(74) *Attorney, Agent, or Firm* — Muncy, Geissler, Olds & Lowe, P.C.

(57) ABSTRACT

A method includes forming a resistance-switching layer and a second electrode over a first electrode. The method includes applying a forming voltage to the resistance-switching layer such that the resistance of the resistance-switching layer is decreased. The method includes applying an initial reset voltage to the first electrode or the second electrode such that the resistance of the resistance-switching layer is increased. The method includes applying a first set voltage to the first electrode or the second electrode such that the resistance of the resistance-switching layer is decreased. The method includes applying a second reset voltage to first electrode or the second electrode such that the resistance of the resistance-switching layer is increased. The method includes applying a second set voltage to first electrode or the second electrode such that the resistance of the resistance-switching layer is decreased. The second set voltage is lower than the first set voltage.

13 Claims, 9 Drawing Sheets

(56) References Cited

U.S. PATENT DOCUMENTS

| | | |
|---|---|---|
| 2011/0108829 A1* | 5/2011 | Banno .............................. 257/43 |
| 2012/0120712 A1 | 5/2012 | Kawai et al. |
| 2012/0241709 A1* | 9/2012 | Tsuji ................................ 257/2 |
| 2012/0305881 A1 | 12/2012 | Wong et al. |

FOREIGN PATENT DOCUMENTS

| | | |
|---|---|---|
| JP | 2011 155159 | 8/2011 |
| TW | 200929526 A | 7/2009 |
| TW | 201216281 A1 | 4/2012 |
| TW | 201234460 A1 | 8/2012 |
| TW | 201248790 A1 | 12/2012 |
| TW | 201304150 A1 | 1/2013 |

OTHER PUBLICATIONS

Office Action from corresponding Japanese application No. 2014-213703, dated Aug. 25, 2015, 4 pages.

Search report from corresponding European application No. 14182654.5-1556 dated Sep. 4, 2015, 8 pages.

* cited by examiner

METHOD FOR FORMING MEMORY DEVICE

CROSS REFERENCE TO RELATED APPLICATIONS

This application claims priority of Taiwan Patent Application No. 103112803, filed on Apr. 8, 2014, the entirety of which is incorporated by reference herein.

BACKGROUND

1. Field of the Disclosure

The disclosure relates to structures and formation methods of memory devices, and in particular to structures and formation methods of resistive random-access memory (RRAM) devices.

2. Description of the Related Art

Recently, a variety of consumer electronic products have become popular, increasing the demand for non-volatile memory devices. Flash memory is one of the mainstream non-volatile memory devices. However, since the size of the devices continues to shrink, flash memory devices have encountered issues such as high operation voltages, slow operation speeds, and bad data retention ability. As a result, future development of the flash memory device is limited.

Therefore, many materials and apparatuses of new type non-volatile memory devices are under development. New type non-volatile memory devices include, for example, magnetic random access memory (MRAM) devices, phase change memory (PCM) devices, and resistive random access memory (RRAM) devices. Among the non-volatile memory devices, RRAM devices have many advantages such as low power consumption, low operation voltages, short write and erase times, high reliability, long memory time, non-destructive read-out, multi-state memory, process simplicity, and only a small area is required.

However, the yield and the efficiency of RRAM devices still need further improvement.

BRIEF SUMMARY OF THE DISCLOSURE

In accordance with one embodiment of the disclosure, a method for forming a memory device is provided. The method includes forming a resistance-switching layer over a first electrode and forming a second electrode over the resistance-switching layer. The method also includes applying a forming voltage to the resistance-switching layer such that the resistance of the resistance-switching layer is decreased. Afterwards, the method includes applying an initial reset voltage to the first electrode or the second electrode layer such that the resistance of the resistance-switching layer is increased. Afterwards, the method includes applying a first set voltage to the first electrode or the second electrode layer such that the resistance of the resistance-switching layer is decreased. Afterwards, the method includes applying a second reset voltage to the first electrode or the second electrode layer such that the resistance of the resistance-switching layer is increased. Afterwards, the method includes applying a second set voltage to the first electrode or the second electrode layer such that the resistance of the resistance-switching layer is decreased. The second set voltage is lower than the first set voltage.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings.

DETAILED DESCRIPTION OF THE DISCLOSURE

The making and using of the embodiments of the disclosure are discussed in detail below. It should be appreciated, however, that the embodiments can be embodied in a wide variety of specific contexts. The specific embodiments discussed are merely illustrative, and do not limit the scope of the disclosure.

Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first material over or on a second material in the description that follows include embodiments in which the first and second materials are formed in direct contact, and may also include embodiments in which additional materials may be formed between the first and second materials, so that the first and second materials may not be in direct contact.

Some variations of the embodiments are described. Throughout the various views and illustrative embodiments, like reference numbers are used to designate like elements.

Figure 1A:
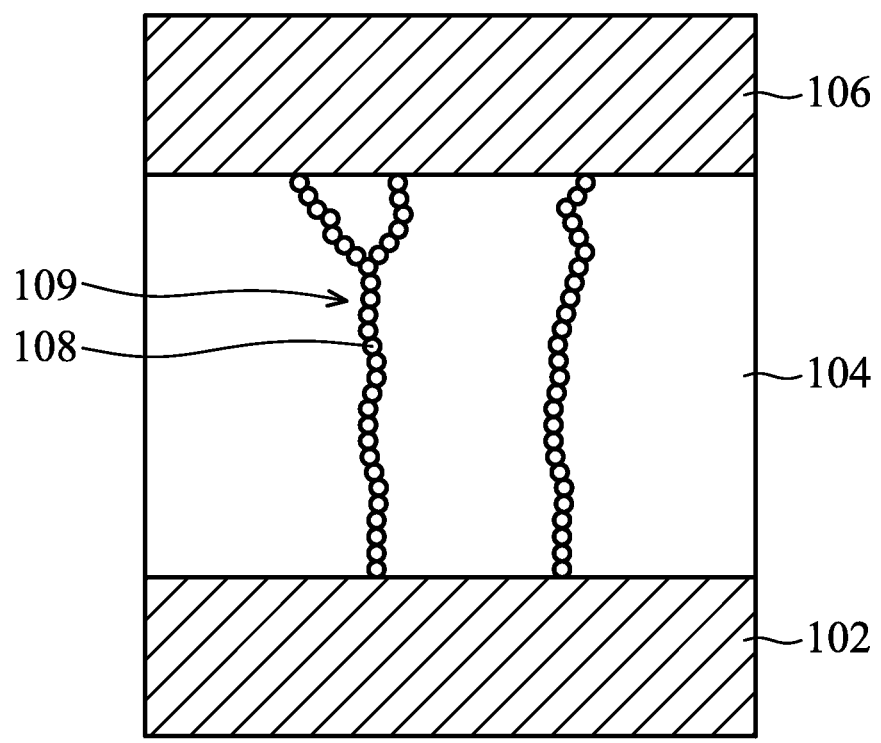
FIG. 1A is a cross-sectional view of a memory device in accordance with some embodiments of the disclosure.
Figure 1B:
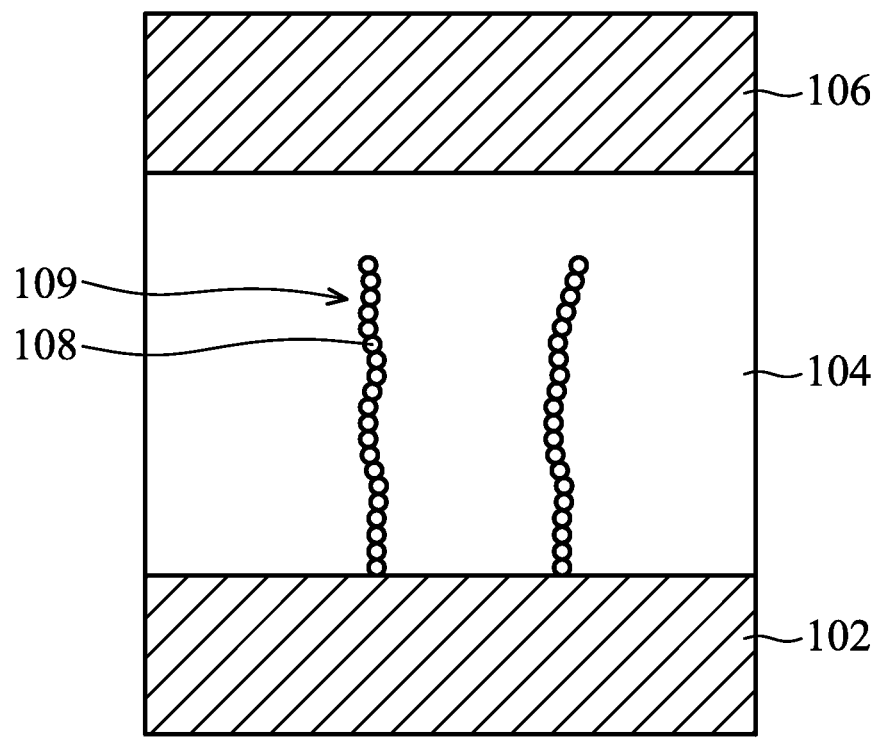
FIG. 1B is a cross-sectional view of a memory device in accordance with some embodiments of the disclosure.

In accordance with some embodiments, FIGS. 1A and 1B are cross-sectional views of a memory device 100 at a low resistance status and a high resistance status, respectively. In some embodiments, the memory device 100 is a resistive random access memory (RRAM) device. As shown in FIG. 1A, the memory device 100 includes an electrode 102, an electrode 106, and a resistance-switching layer 104 between the electrodes.

In some embodiments, the resistance-switching layer 104 is made of a dielectric material and is usually electrically insulating. However, the resistance-switching layer 104 may increase its electrical conductivity after applying a sufficiently high voltage on it. For example, through a forming process, one or more conductive paths (for example, conductive filaments) may be formed in the resistance-switching layer 104. When the conductive paths extend towards and approaching the electrodes 102 and 106, the resistance of the resistance-switching layer 104 may be reduced significantly. Afterwards, a reverse voltage may be applied to partially destroy the formed conductive filaments or the conductive paths. As a result, the resistance of the resistance-switching layer 104 is increased.

Figure 2A:
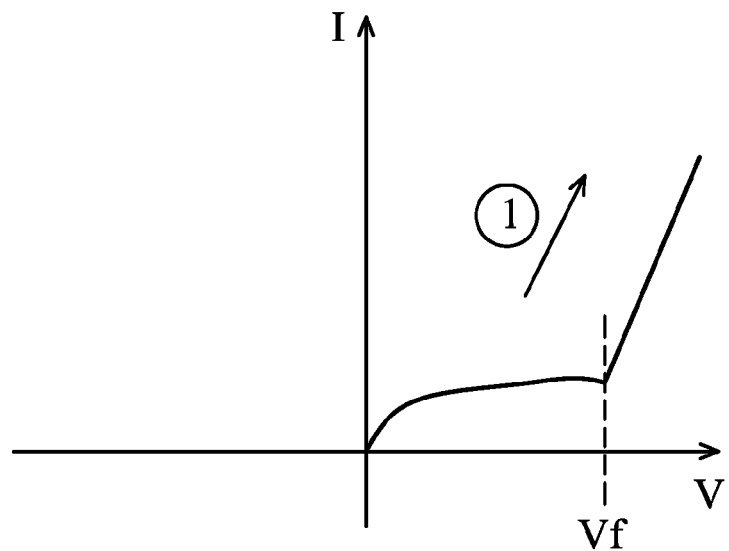
FIGS. 2A-2D show the graphs of I-V curves obtained from the memory devices in accordance with some embodiments of the disclosure.

FIGS. 2A-2D are the graphs of the I-V curves obtained from the memory devices in accordance with some embodiments of the disclosure. In some embodiments, a forming process is performed to activate or turn on the memory device 100. As shown in FIGS. 2A and 1A, a gradually increasing bias voltage is applied to the electrode 102 or the electrode 106 (such as route 1 shown in FIG. 2A). The bias voltage may induce negatively charged ions (such as oxygen ions or nitrogen ions) in the resistance-switching layer 104 to move to the electrodes such that a series of vacancies 108 are formed in the resistance-switching layer 104. The vacancies 108 are, for example, oxygen vacancies or nitrogen vacancies. The vacancies 108 may be increased gradually with the increase of the bias voltage. When the bias voltage is increased to the level of a forming voltage $V_f$, these vacancies 108 may be connected in series to become a conductive filament 109 connecting the electrodes 102 and 106 so as to form a conductive path. As a result, the current passing through the resistance-switching layer 104 may be increased significantly, as shown in FIG. 2A. Alternatively, in some other embodiments, the forming voltage is directly applied to the resistance-switching layer 104 to form one or more conductive paths.

Figure 2B:
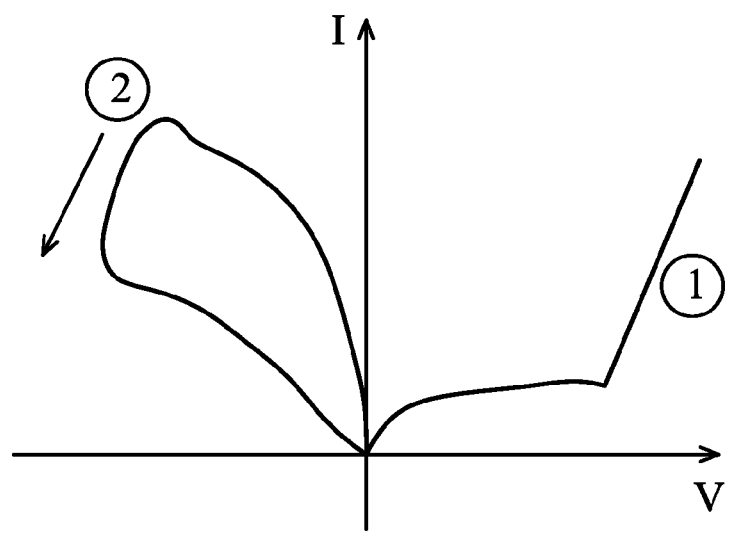

As shown in FIGS. 1B and 2B, in some embodiments, a reverse bias voltage is applied to the electrode 106 or the electrode 102 to initially reset the resistance-switching layer 104 such that its resistance goes back to the high resistance status (such as route 2 shown in FIG. 2B). For example, the reverse bias voltage may cause some of the vacancies 108 to disappear such that the conductive filament 109 is partially broken. Therefore, the conductive path between the electrodes formed by the vacancies 108 disappears. This may be due to high heat, induced by the current, repairing defects in the resistance-switching layer 104. Therefore, some of the vacancies 108 disappear such that the resistance-switching layer 104 returns to the high resistance status.

Figure 2C:
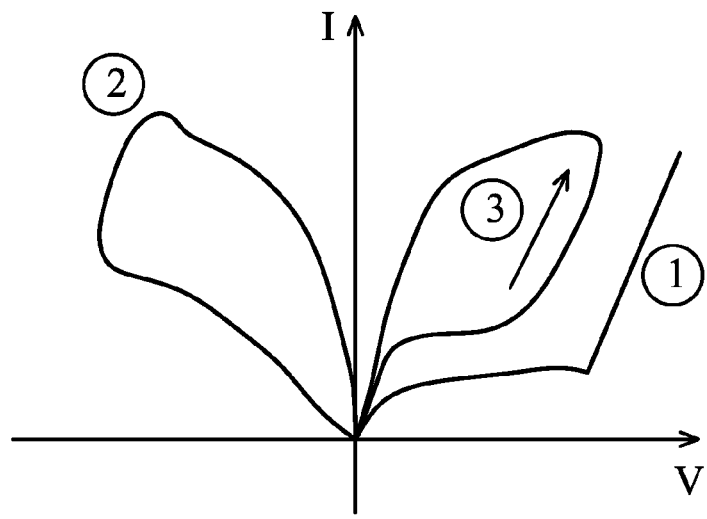

Afterwards, as shown in route 3 in FIG. 2C, a gradually increasing bias voltage is applied to the electrode 102 or the electrode 106 to set the resistance-switching layer 104, in accordance with some embodiments. Because the vacancies 108 have been formed in the resistance-switching layer 104 during the previous forming process (as shown in FIG. 2A), the vacancies do not disappear completely and partly remain after the initial reset shown in FIG. 2B. Therefore, in some embodiments, a bias voltage (such as a set voltage), which is lower than the forming voltage, is sufficient to turn the resistance status of the resistance-switching layer 104 to be the low resistance status. In other words, because there have been vacancies 108 in the resistance-switching layer 104, a lower bias voltage is sufficient to form a conductive filament connecting the electrodes in series.

Figure 2D:
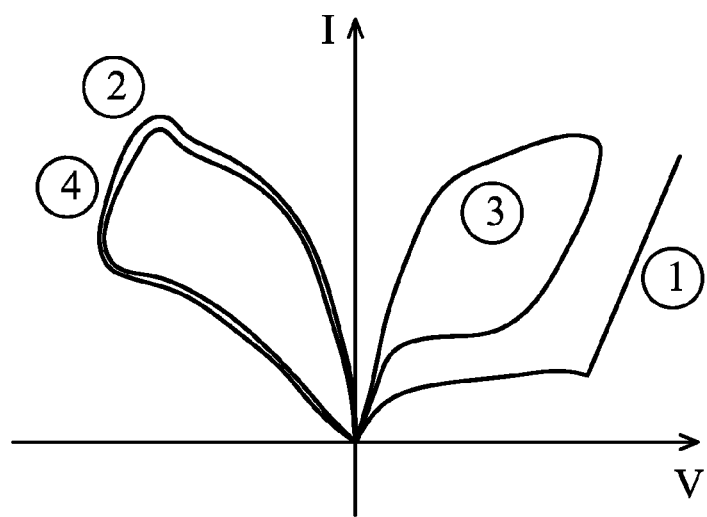

Afterwards, as shown in route 4 in FIG. 2D, a reset is performed again to change the status of the resistance-switching layer 104 to the high resistance status, in accordance with some embodiments. In some embodiments, multiple reset operations are performed to stabilize the electrical characteristics of the resistance-switching layer 104. For example, five to ten reset operations may be performed.

As mentioned above, the resistance status of the resistance-switching layer 104 may be adjusted through the application of voltage. Therefore, the data may be stored in the resistance-switching layer 104. By detecting the current passing through the resistance-switching layer 104, the resistance information of the resistance-switching layer 104 may be obtained so as to get the desired storage information.

Figure 3:
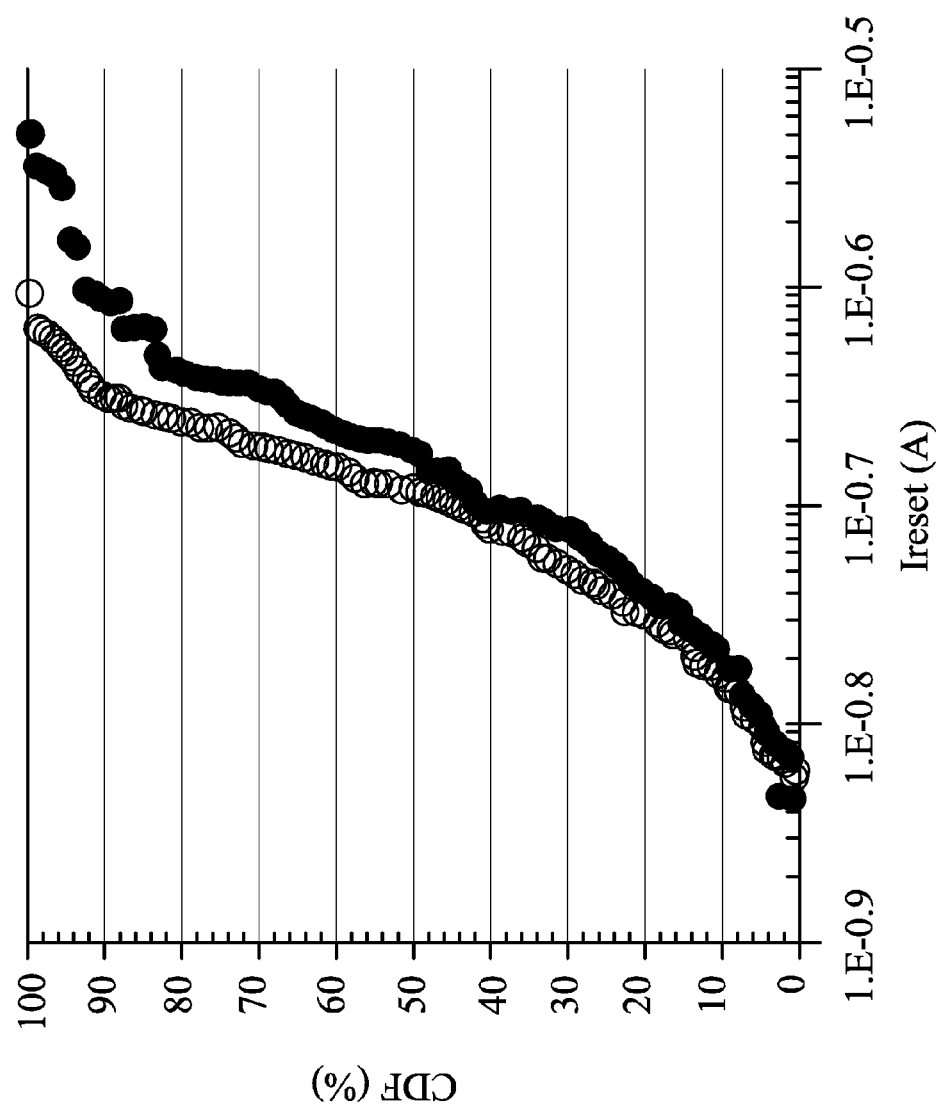
FIG. 3 shows a graph of cumulative distribution function of the reset currents of memory devices before and after baked in accordance with some embodiments of the disclosure.

In some embodiments, the memory device 100 is baked to test the reliability of the memory device 100 (also called the retention test). For example, the memory device 100 may be baked at a temperature of about 175° C. for about 24 hours. FIG. 3 shows a graph of the cumulative distribution function of the reset currents of the memory devices before and after baked in accordance with some embodiments. Through measuring the reset currents ($I_{reset}$) of the memory devices in a same wafer, the distribution of the reset currents of these memory devices may be obtained. In FIG. 3, the hollow circular dots are used to illustrate the distribution of the reset currents before the memory devices are baked. The solid circular dots are used to illustrate the distribution of the reset currents after the memory devices are baked.

As shown in FIG. 3, after the baking operation, the distribution of the reset currents tends to become higher. For example, over 5% of the memory devices have a reset current higher than a standard value, such as $10^{-6}$ A. A reset current higher than the standard value is not easy to distinguish from the set current, which may cause an error in identification of the storage data of the memory device. The instability of the reset currents of the memory devices leads to degradation of yield of the memory devices.

In order to resolve the problems mentioned above, embodiments of the disclosure provide a method for forming a memory device, which may improve the yield of the memory device.

As shown in FIG. 1A, the electrode 102 is formed over a substrate (not shown) in accordance with some embodiments. The substrate may include a semiconductor substrate or other suitable substrates. In some embodiments, the substrate is a semiconductor wafer, such as a silicon wafer. In some embodiments, the material of the electrode 102 includes metal nitride. In some embodiments, the material of the electrode 102 includes titanium nitride (TiN), platinum (Pt), aluminum copper (AlCu), titanium (Ti), gold (Au), tantalum (Ta), tantalum nitride (TaN), tungsten (W), tungsten nitride (WN), copper (Cu), other suitable conductive material, or a combination thereof. In some embodiments, a conductive material is deposited over the substrate to form the electrode 102. For example, by using a patterning process, the conductive material may be patterned to form the desired electrode. In some embodiments, the conductive material is formed by using a physical vapor deposition process, an electroplating process, a chemical vapor deposition process, a spin coating process, other applicable process, or a combination thereof.

Afterwards, as shown in FIG. 1A, the resistance-switching layer 104 is formed over the electrode 102 in accordance with some embodiments. The material of the resistance-switching layer 104 may include oxide, nitride, other suitable dielectric material, or a combination thereof. For example, the resistance-switching layer 104 is made of hafnium oxide, zirconium oxide, titanium oxide, tantalum oxide, tungsten oxide, aluminum oxide, zinc oxide, nickel oxide, copper oxide, other suitable material, or a combination thereof. In some embodiments, a dielectric material is deposited over the electrode 102 to form the resistance-switching layer 104 by an atomic layer deposition (ALD) process, a chemical vapor deposition (CVD) process, a physical vapor deposition (PVD) process, a spin coating process, a spray coating process, other applicable process, or a combination thereof. In some embodiments, the resistance-switching layer 104 is doped with other elements. In some embodiments, the deposited dielectric material is patterned so that the resistance-switching layer 104 has a desired pattern.

Afterwards, as shown in FIG. 1A, the electrode 106 is formed over the resistance-switching layer 104 in accordance with some embodiments. The material of the electrode 106 may include metal nitride. In some embodiments, the electrode 106 is made of titanium nitride (TiN), platinum (Pt), aluminum copper (AlCu), titanium (Ti), gold (Au), tantalum (Ta), tantalum nitride (TaN), tungsten (W), tungsten nitride (WN), copper (Cu), other suitable conductive material, or a combination thereof. In some embodiments, a conductive material is deposited over the resistance-switching layer 104 to form the electrode 106. For example, by using a patterning process, the conductive material may be patterned to form the desired electrode. In some embodiments, the conductive material is formed using a PVD process, an electroplating process, a CVD process, a spin coating process, other applicable process, or a combination thereof.

Embodiments of the disclosure have many variations. For example, another material layer may be formed between the electrodes and the resistance-switching layer. For example, a buffer layer and/or a barrier layer.

Figure 4:
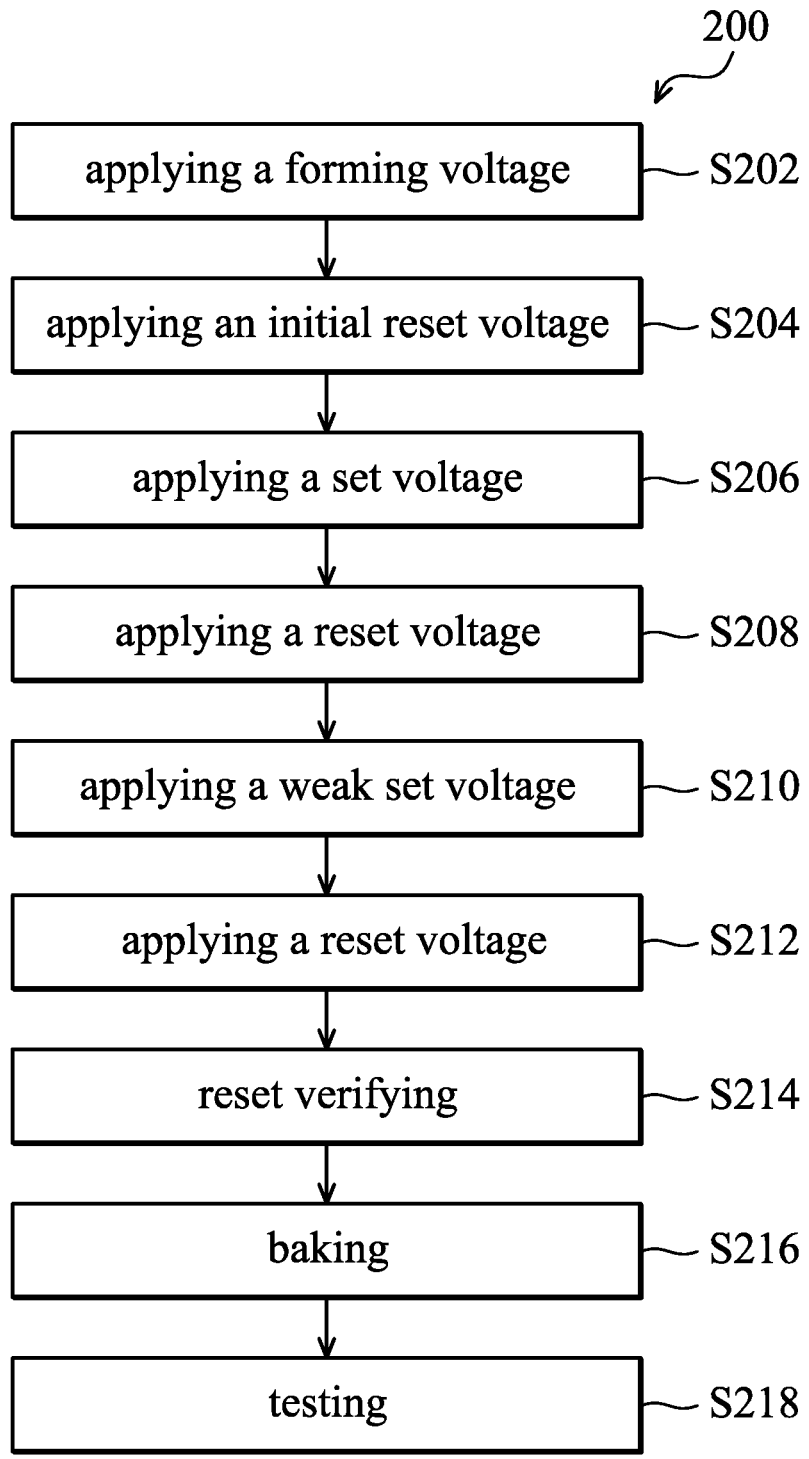
FIG. 4 is a flow chart of a method for forming a memory device in accordance with some embodiments of the disclosure.

In some embodiments, a variety of operations are performed to the memory device to activate the memory device. FIG. 4 is a flow chart of a method for forming a memory device. In some embodiments, the method 200 begins with an operation S202 in which a forming voltage is applied to the memory device. As shown in FIG. 1A, a forming voltage is applied to the electrode 102 or 106 to form the conductive filament 109 in the resistance-switching layer 104 such that the resistance of the resistance-switching layer 104 is reduced. In some embodiments, the forming voltage is applied separately. For example, a voltage, which is lower than $V_f$, is applied first followed by another application of $V_f$. Applying the forming voltage separately may improve the performance of the memory device. For example, the set current of the memory device may be more stable.

Afterwards, the method 200 continues with an operation S204 in which an initial reset voltage is applied to the memory device. In some embodiments, the initial reset voltage and the forming voltage are voltages with opposite polarities. As shown in FIG. 1B, the initial reset voltage is applied to the electrode 102 or 106 such that the resistance of the resistance-switching layer 104 is increased and returns to the high resistance status. Afterwards, the method 200 continues with an operation S206 in which a set voltage is applied to the memory device such that the resistance of the resistance-switching layer 104 is reduced and transformed the high resistance status into the low resistance status. The set voltage may be lower than the forming voltage. In some embodiments, the set voltage and the forming voltage have the same polarity, and the set voltage and the initial reset voltage have opposite polarities. Afterwards, the method 200 continues with an operation S208 in which a reset voltage is applied to the memory device such that the resistance of the resistance-switching layer 104 is increased again and is transformed the low resistance status into the high resistance status.

Unlike the embodiments mentioned above where multiple reset operations are performed before baking, a weak set operation is performed first to the memory device in accordance with some embodiments. As shown in FIG. 4, the method 200 continues with an operation S210 in which a weak set voltage is applied to the electrode 102 or 106 such that the resistance of the resistance-switching layer 104 is reduced in accordance with some embodiments. In some embodiments, the weak set voltage and the set voltage have the same polarity, and the weak set voltage and the reset voltage have opposite polarities. The weak set voltage is lower than the set voltage. In some embodiments, the amount of the weak set voltage is in a range from about 30% to about 80% of the amount of the set voltage. In some other embodiments, the amount of the weak set voltage is in a range from about 50% to about 70% of the amount of the set voltage. For example, the set voltage may be about 3V (volt), and the weak set voltage may be in a range from about 1V to about 2V. In some embodiments, the set voltage is higher than the weak set voltage by about 1V to about 2V. In some embodiments, performing the weak set operation to the resistance-switching layer 104 helps to improve the performance of the memory device.

The method 200 continues with an operation S212 in which a reset voltage is applied to the memory device such that the resistance of the resistance-switching layer 104 is increased and returns to the high resistance status. Afterwards, the method 200 continues with an operation S214 in which the memory device is reset-verified. In some embodiments, multiple reset operations are performed continuously to ensure that the resistance-switching layer 104 is electrically stable. For example, five to ten reset operations may be performed. After the reset verifying operation, the reset current of each of the memory devices in the wafer may be obtained. Afterwards, the method 200 continues with an operation S216 in which the memory device is baked. The baking operation may be used to simulate a situation in which the memory device has been operated for a long time. For example, a wafer having a number of memory devices may be baked at a temperature of about 175° C. for about 24 hours. Afterwards, the method 200 continues with an operation S218 in which an electrical testing operation is performed to the memory devices after baked. For example, the reset current of each of the memory devices in the wafer which have been baked may be obtained. Embodiments of the disclosure have many variations. In some embodiments, the memory device is not baked.

Figure 5:
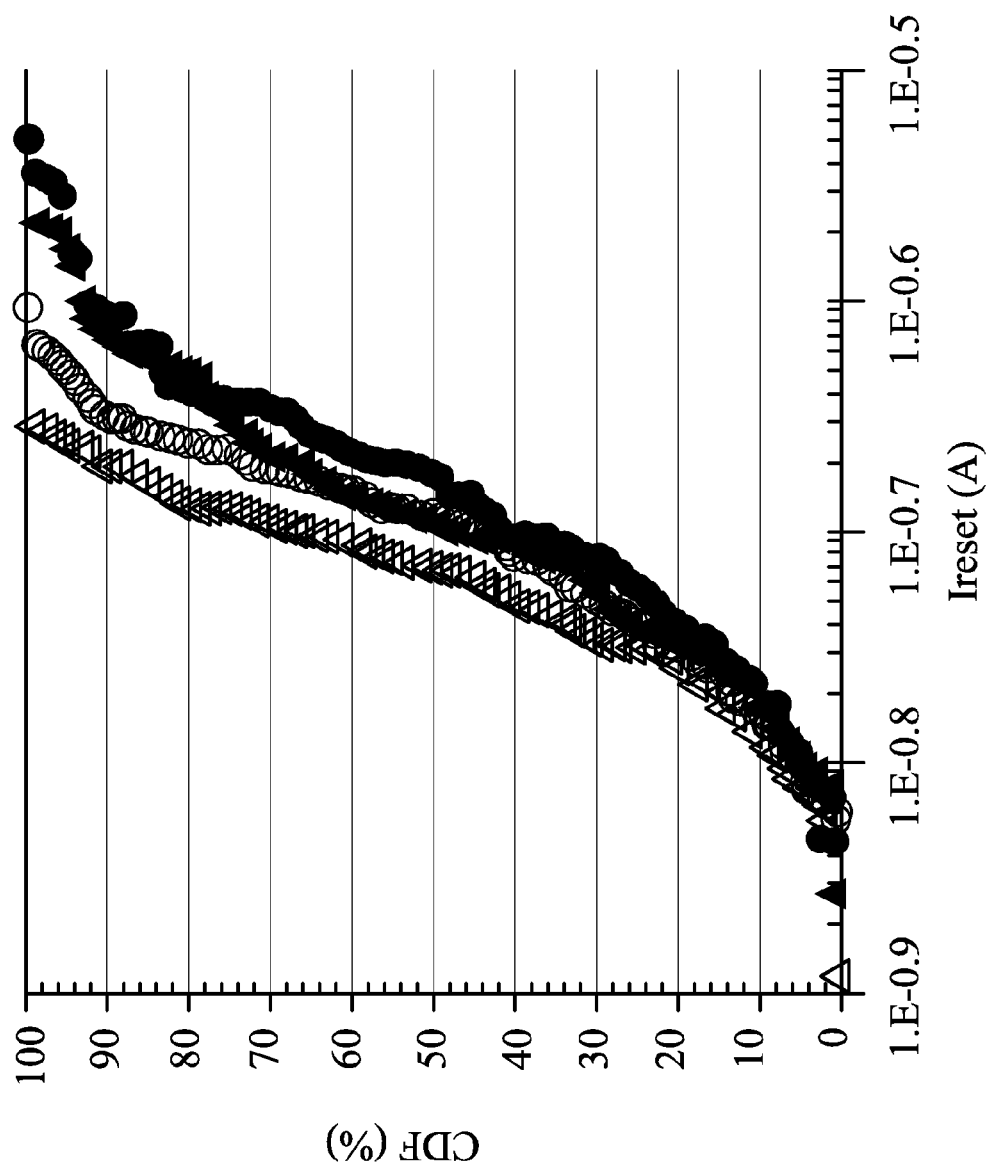
FIG. 5 shows a graph of cumulative distribution function of the reset currents of the memory devices before and after baked in accordance with some embodiments of the disclosure.

FIG. 5 shows the graph of the cumulative distribution function of the reset currents of memory devices before and after baked. In FIG. 5, the circular dots are used to represent the reset currents of the memory devices which have not been treated by the weak set operation (operation S210), wherein the hollow circular dots and the solid circular dots are used to represent the distribution of the reset currents of the memory devices before and after baked, respectively. In FIG. 5, the triangular dots are used to represent the reset currents of the memory devices which have been treated by the weak set operation (operation S210 is performed), wherein the hollow triangular dots and the solid triangular dots are used to represent the distribution of the reset currents of the memory devices before and after baked, respectively.

As shown in FIG. 5, before the baking operation, the reset currents of the memory devices which have been treated by the weak set operation are generally lower than those of the memory devices which have not been treated by the weak set operation. In addition, the distribution of the reset currents of the memory devices which have been treated by the weak set operation is more even. Therefore, it is easier to distinguish the reset current of the memory device that has been treated by the weak set operation from the set current thereof. The identification is easier.

As shown in FIG. 5, after the baking operation, the reset currents of the memory devices which have been treated by the weak set operation are also generally lower than those of the memory devices which are not treated by the weak set operation. In addition, the differences between the reset currents of the memory devices which have been treated by the weak set operation before and after the baking operation are lower than those of the memory devices which are not treated by the weak set operation. Therefore, the memory devices which have been treated by the weak set operation have better reliability.

Figure 6A:
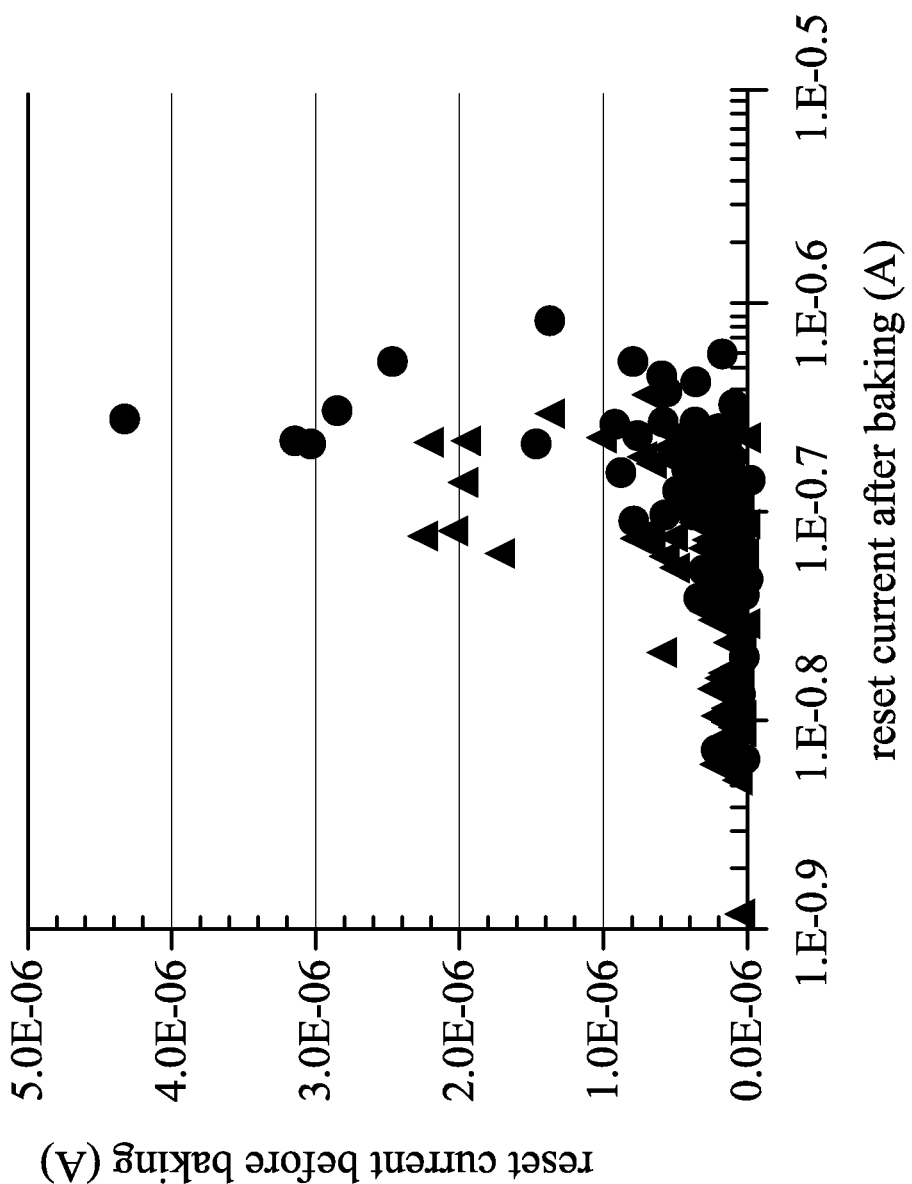
FIG. 6A shows a graph of the relationship between the reset currents of the memory devices before and after baked in accordance with some embodiments of the disclosure.

FIG. 6A shows a graph of the relationship between the reset currents of the memory devices before and after baked. In FIG. 6A, the solid circular dots represent the relationship between the reset currents of the memory devices which have not been treated by the weak set operation before and after baked. The solid triangular dots represent the relationship between the reset currents of the memory devices which have been treated by the weak set operation before and after baked. It can be seen in FIG. 6A that the variations between the reset currents of the memory devices which have been treated by the weak set operation before and after baked are lower. Therefore, the memory devices which have been treated by the weak set operation have a better reliability. As shown in FIG. 6A, no matter whether it is before or after the baking operation, most of the solid triangular dots distribute in the region lower than about $10^{-6}$ A. In addition, the reset currents of the memory devices which have been treated by the weak set operation are still generally lower than about $10^{-6}$ A after the baking operation. Therefore, it is easier to distinguish the reset current from the set current.

Figure 6B:
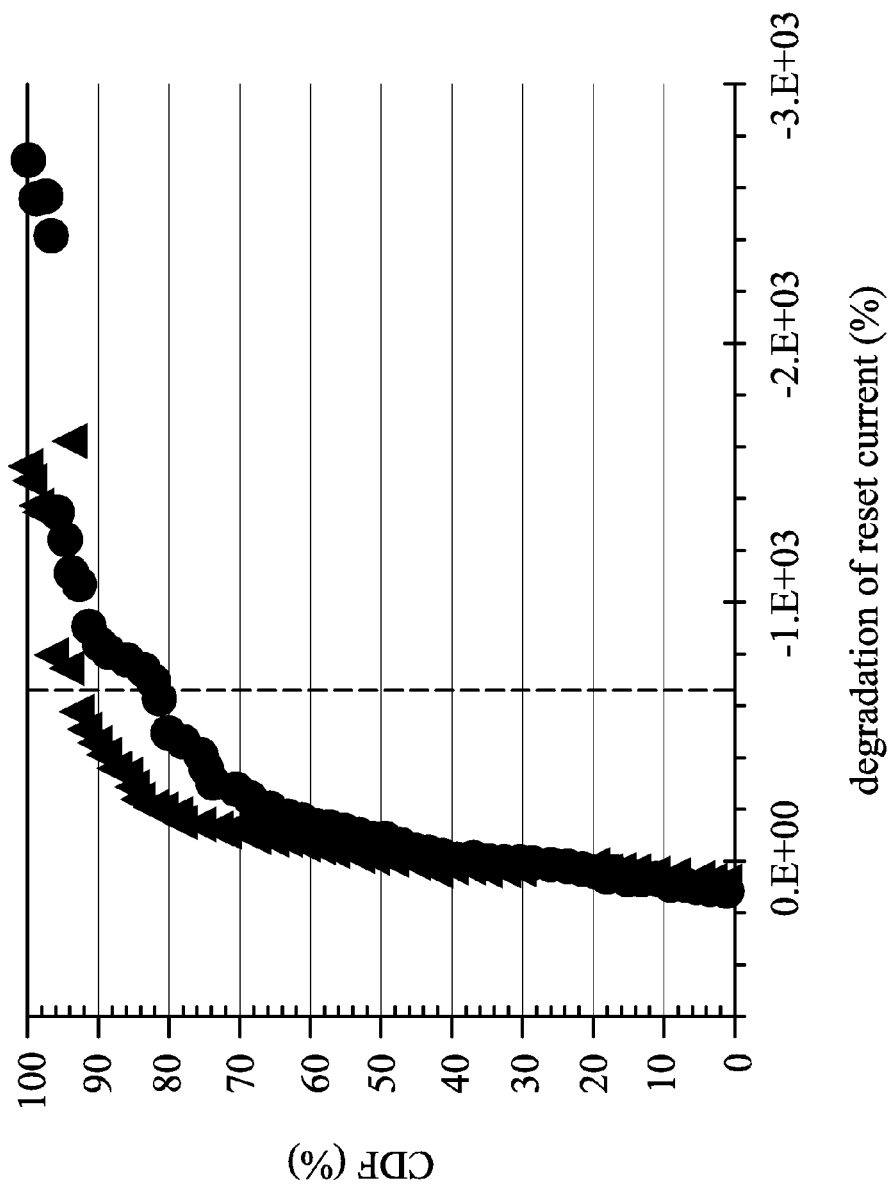
FIG. 6B shows a graph of cumulative distribution function of the reset current degradations of memory devices in accordance with some embodiments of the disclosure.

FIG. 6B shows a graph of the cumulative distribution function of the reset current degradations of memory devices. The reset current degradation means the reduced ratio of the reset current after the baking operation. In FIG. 6B, the solid circular dots represent the cumulative distribution function of the reset current degradations of the memory devices which are not treated by the weak set operation. The solid triangular dots represent the cumulative distribution function of the reset current degradations of the memory devices which have been treated by the weak set operation. As shown in FIG. 6B, it can be found that the reset current degradations of the memory devices which have been treated by the weak set operation are generally lower.

As mentioned above, the additional weak set operation improves the performance of the memory device. The mechanism where the weak set operation is beneficial is not currently clear. It might because the weak set operation before the multiple reset operations can limit the conductive filaments to specific regions. Due to the controlled distribution area of the conductive filaments, the electrical characteristics of the resistance-switching layer are more stable.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments described in the specification.

What is claimed is:

1. A method for forming a memory device, comprising:
   forming a resistance-switching layer over a first electrode;
   forming a second electrode over the resistance-switching layer;
   applying a forming voltage to the resistance-switching layer such that the resistance of the resistance-switching layer is decreased;
   after the forming voltage is applied, applying an initial reset voltage to the first electrode or the second electrode such that the resistance of the resistance-switching layer is increased;
   after the initial reset voltage is applied, applying a first set voltage to the first electrode or the second electrode such that the resistance of the resistance-switching layer is decreased;
   after the first set voltage is applied, applying a second reset voltage to the first electrode or the second electrode such that the resistance of the resistance-switching layer is increased; and
   after the second reset voltage is applied, applying a second set voltage to the first electrode or the second electrode such that the resistance of the resistance-switching layer is decreased, wherein the second set voltage is lower than the first set voltage.

2. The method for forming a memory device as claimed in claim 1, wherein the forming voltage is higher than the first set voltage.

3. The method for forming a memory device as claimed in claim 1, wherein the amount of the second set voltage is in a range from about 30% to about 80% of the amount of the first set voltage.

4. The method for forming a memory device as claimed in claim 1, wherein the first set voltage is higher than the second set voltage by about 1 volt to about 2 volts.

5. The method for forming a memory device as claimed in claim 1, further comprising applying a third reset voltage to the first electrode or the second electrode after the second set voltage is applied.

6. The method for forming a memory device as claimed in claim 1, further comprising repeatedly applying a third reset voltage to the first electrode or the second electrode after the second set voltage is applied.

7. The method for forming a memory device as claimed in claim 6, further comprising baking the resistance-switching layer.

8. The method for forming a memory device as claimed in claim 1, wherein the first set voltage and the second set voltage have the same polarity.

9. The method for forming a memory device as claimed in claim 1, wherein the second set voltage and the second reset voltage have opposite polarities.

10. The method for forming a memory device as claimed in claim 1, further comprising applying a voltage to the first electrode or the second electrode before the forming voltage is applied, wherein the voltage is lower than the forming voltage, and the voltage and the forming voltage have the same polarity.

11. The method for forming a memory device as claimed in claim 1, wherein the resistance-switching layer comprises hafnium oxide, zirconium oxide, titanium oxide, tantalum oxide, tungsten oxide, aluminum oxide, zinc oxide, nickel oxide, copper oxide, other suitable material, or a combination thereof.

12. A method for forming a memory device, comprising:
    forming a resistance-switching layer over a first electrode;
    forming a second electrode over the resistance-switching layer;
    performing a forming process to the resistance-switching layer;
    initially resetting the resistance-switching layer;
    setting the resistance-switching layer by applying a set voltage to first electrode or the second electrode;
    resetting the resistance-switching layer again after the step of setting the resistance-switching layer; and
    applying a voltage to the first electrode or the second electrode after the step of resetting the resistance-switching layer again, wherein the voltage is lower than the set voltage.

13. The method for forming a memory device as claimed in claim 12, wherein the resistance-switching layer comprises hafnium oxide, zirconium oxide, titanium oxide, tantalum oxide, tungsten oxide, aluminum oxide, zinc oxide, nickel oxide, copper oxide, other suitable material, or a combination thereof.

* * * * *